(12) United States Patent
Zhou (10) Patent No.: US 10,636,506 B2
(45) Date of Patent: Apr. 28, 2020

(54) METHODS FOR TESTING A STORAGE UNIT AND APPARATUSES USING THE SAME

(71) Applicant: Shannon Systems Ltd., Shanghai (CN)

(72) Inventor: Zhen Zhou, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 74 days.

(21) Appl. No.: 15/663,958

(22) Filed: Jul. 31, 2017

(65) Prior Publication Data

US 2018/0102182 A1    Apr. 12, 2018

(30) Foreign Application Priority Data

Oct. 8, 2016    (CN) .......................... 2016 1 0879580

(51) Int. Cl.
| | |
|---|---|
| *G11C 29/00* | (2006.01) |
| *G11C 29/10* | (2006.01) |
| *G11C 29/42* | (2006.01) |
| *G11C 29/36* | (2006.01) |
| *G06F 11/10* | (2006.01) |
| *G11C 29/52* | (2006.01) |
| *G11C 29/04* | (2006.01) |
| *H03M 13/13* | (2006.01) |

(Continued)

(52) U.S. Cl.
CPC .......... *G11C 29/10* (2013.01); *G06F 11/1048* (2013.01); *G06F 11/1068* (2013.01); *G11C 29/36* (2013.01); *G11C 29/42* (2013.01); *G11C 29/52* (2013.01); *G11C 2029/0405* (2013.01); *H03M 13/09* (2013.01); *H03M 13/13* (2013.01); *H03M 13/2906* (2013.01)

(58) Field of Classification Search
CPC ......... G11C 29/10; G11C 29/52; G11C 29/36; G11C 29/42; G11C 29/0405; G06F 11/10; G06F 11/1068; H03M 13/29; H03M 13/2906
USPC ................ 714/718, 719, 724, 738, 742, 758
See application file for complete search history.

(56) References Cited

U.S. PATENT DOCUMENTS

| | | | | |
|---|---|---|---|---|
| 5,875,293 | A | * | 2/1999 | Bell ........................ G06F 11/22 714/27 |
| 7,729,384 | B1 | * | 6/2010 | Mantri .................. H04L 1/0041 370/476 |

(Continued)

FOREIGN PATENT DOCUMENTS

TW            I401691 B      7/2013

*Primary Examiner* — Albert Decady
*Assistant Examiner* — Osman M Alshack
(74) *Attorney, Agent, or Firm* — McClure, Qualey & Rodack, LLP (57) ABSTRACT

The invention introduces a method for testing a storage unit, performed by a processing unit, including at least the following steps: after receiving a test write command from a host device through a first access interface, directing a second access interface to receive a first test pattern from a test writer and program the first test pattern into a PBA (Physical Block Address) of a storage unit; directing the second access interface to read a second test pattern from the PBA of the storage unit and output the second test pattern to a test reader; receiving a test result from the test reader; and generating a test message according to the test result and replying with the test message to the host device.

20 Claims, 8 Drawing Sheets

(51) Int. Cl.
    *H03M 13/09*    (2006.01)
    *H03M 13/29*    (2006.01)

(56) References Cited

U.S. PATENT DOCUMENTS

| | | | |
|---|---|---|---|
| 8,429,426 B2 * | 4/2013 | Minz .................... G06F 21/85 | 380/30 |
| 2006/0200708 A1 * | 9/2006 | Gentieu .................. H04L 1/243 | 714/704 |
| 2006/0220928 A1 * | 10/2006 | Ito ........................ H03M 5/145 | 341/50 |
| 2006/0256875 A1 * | 11/2006 | McClellan ............ H04L 1/0041 | 375/242 |
| 2008/0052564 A1 | 2/2008 | Yim et al. | |
| 2009/0183032 A1 * | 7/2009 | Frey ...................... G11C 29/50 | 714/42 |
| 2013/0080854 A1 | 3/2013 | Nicholas et al. | |
| 2013/0111301 A1 * | 5/2013 | Chu .................... G06F 11/1008 | 714/766 |
| 2013/0124932 A1 | 5/2013 | Schuh et al. | |
| 2014/0129883 A1 | 5/2014 | Spruth et al. | |
| 2014/0359395 A1 | 12/2014 | Ellis et al. | |
| 2015/0052416 A1 | 2/2015 | Prohofsky et al. | |
| 2015/0082104 A1 * | 3/2015 | Falanga ............. G11C 29/4401 | 714/719 |
| 2015/0154943 A1 * | 6/2015 | Lee ......................... G09G 5/18 | 345/204 |
| 2015/0242657 A1 * | 8/2015 | Kim ....................... G06F 21/78 | 713/193 |
| 2015/0280742 A1 * | 10/2015 | Liu ..................... G06F 12/0802 | 714/758 |
| 2016/0062908 A1 * | 3/2016 | Shen .................... G11C 7/1072 | 711/103 |
| 2016/0124826 A1 * | 5/2016 | Sugahara ................ G06F 11/27 | 714/30 |
| 2016/0277041 A1 * | 9/2016 | Zhang .................. H03M 13/45 | |

* cited by examiner

FIG. 8

# METHODS FOR TESTING A STORAGE UNIT AND APPARATUSES USING THE SAME

CROSS REFERENCE TO RELATED APPLICATIONS

This Application claims priority of China Patent Application No. 201610879580.5, filed on Oct. 8, 2016, the entirety of which is incorporated by reference herein.

BACKGROUND

Technical Field

The present invention relates to flash memory, and in particular to methods for testing a storage unit and apparatuses using the same.

Description of the Related Art

Flash memory devices typically include NOR flash devices and NAND flash devices. NOR flash devices are random access—a host accessing a NOR flash device can provide the device with any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest unit of flash memory that can be written in a single operation) or a block (the smallest unit of flash memory that can be erased in a single operation), and not a single byte or word. In reality, a NAND flash device always reads complete pages from the memory cells and writes complete pages to the memory cells. After a page of data is read from the array into a buffer inside the device, the host can access the data bytes or words one by one by serially clocking them out using a strobe signal.

With the increasing capacity of memory cells used in NAND flash devices, which typically contain a multiple of the capacity of a DRAM (Dynamic Random Access Memory) of the host, it is very difficult to find and test all defective blocks of the memory cells. In order to raise the reliability to an acceptable level, the host requires tens of loops for programming, reading or erasing each NAND page and verifying each data bit, so as to find and identify all bad blocks. However, the above test consumes excessive computations and DRAM space of the host, and bus bandwidth between the host and the NAND flash device. Accordingly, what is needed are methods for testing a storage unit and apparatuses using the same to reduce the testing cost of the host.

BRIEF SUMMARY

An embodiment of the invention introduces a method for testing a storage unit, performed by a processing unit, including at least the following steps: after receiving a test write command from a host device through a first access interface, directing a second access interface to receive a first test pattern from a test writer and program the first test pattern into a PBA (Physical Block Address) of a storage unit; directing the second access interface to read a second test pattern from the PBA of the storage unit and output the second test pattern to a test reader; receiving a test result from the test reader; and generating a test message according to the test result and replying the test message to the host device.

An embodiment of the invention introduces an apparatus for testing a storage unit contains at least a test writer, a test reader and a processing unit. The processing unit, coupled to the test writer and the test reader, directs a second access interface to receive a first test pattern from the test writer and program the first test pattern into a PBA of a storage unit after receiving a test write command from a host device through a first access interface; directs the second access interface to read a second test pattern from the PBA of the storage unit and output the second test pattern to the test reader; receives a test result from the test reader; generates a test message according to the test result; and replies with the test message to the host device.

A detailed description is given in the following embodiments with reference made to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
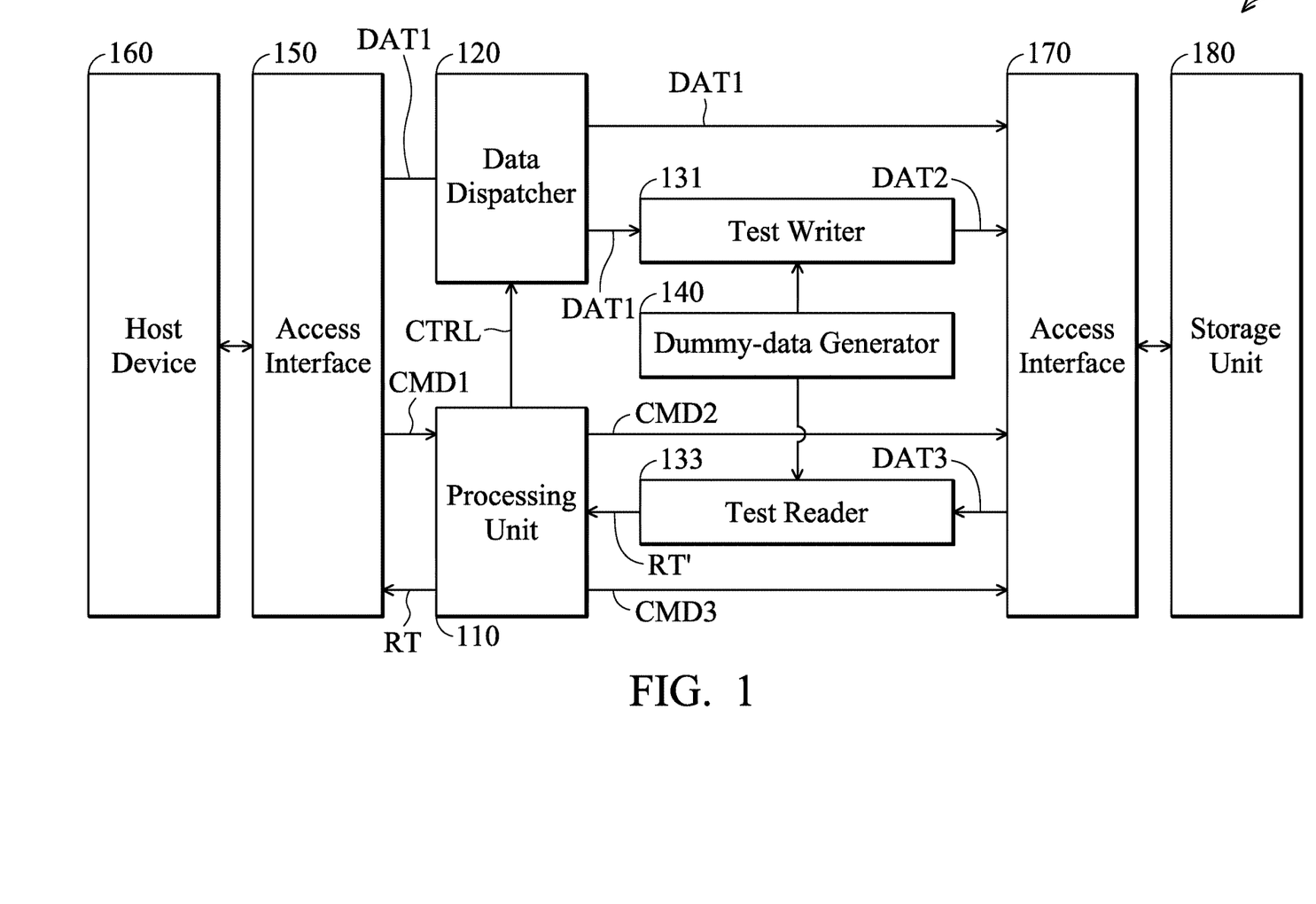
FIG. 1 is the system architecture of a flash memory according to an embodiment of the invention.

FIG. 1 is the system architecture of a flash memory according to an embodiment of the invention. The system architecture 10 of the flash memory contains a processing unit 110. The processing unit 110 can be implemented in numerous ways, such as with dedicated hardware, or with general-purpose hardware (e.g., a single processor, multiple processors or graphics processing units capable of parallel computations, etc.) that is programmed using microcode or software instructions to perform the functions recited herein. The processing unit 110 may contain one or more ALUs (Arithmetic and Logic Units) and bit shifters. The ALU is responsible for performing boolean operations (such as, AND, OR, NOT, NAND, NOR, XOR, XNOR, etc.) and also for performing integer addition and subtraction. The bit shifter is responsible for bitwise shifts and rotations. The system architecture 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the storage unit 180 using a SDR (Single Data Rate) protocol or a DDR (Double Data Rate) protocol, such as ONFI (open NAND flash interface), DDR toggle, or others. The processing unit 110 may communicate with the host device 160 through an access interface 150 using a standard protocol, such as USB (Universal Serial Bus), ATA (Advanced Technology Attachment), SATA (Serial ATA), PCI-E (Peripheral Component Interconnect Express) or others.

Figure 2:
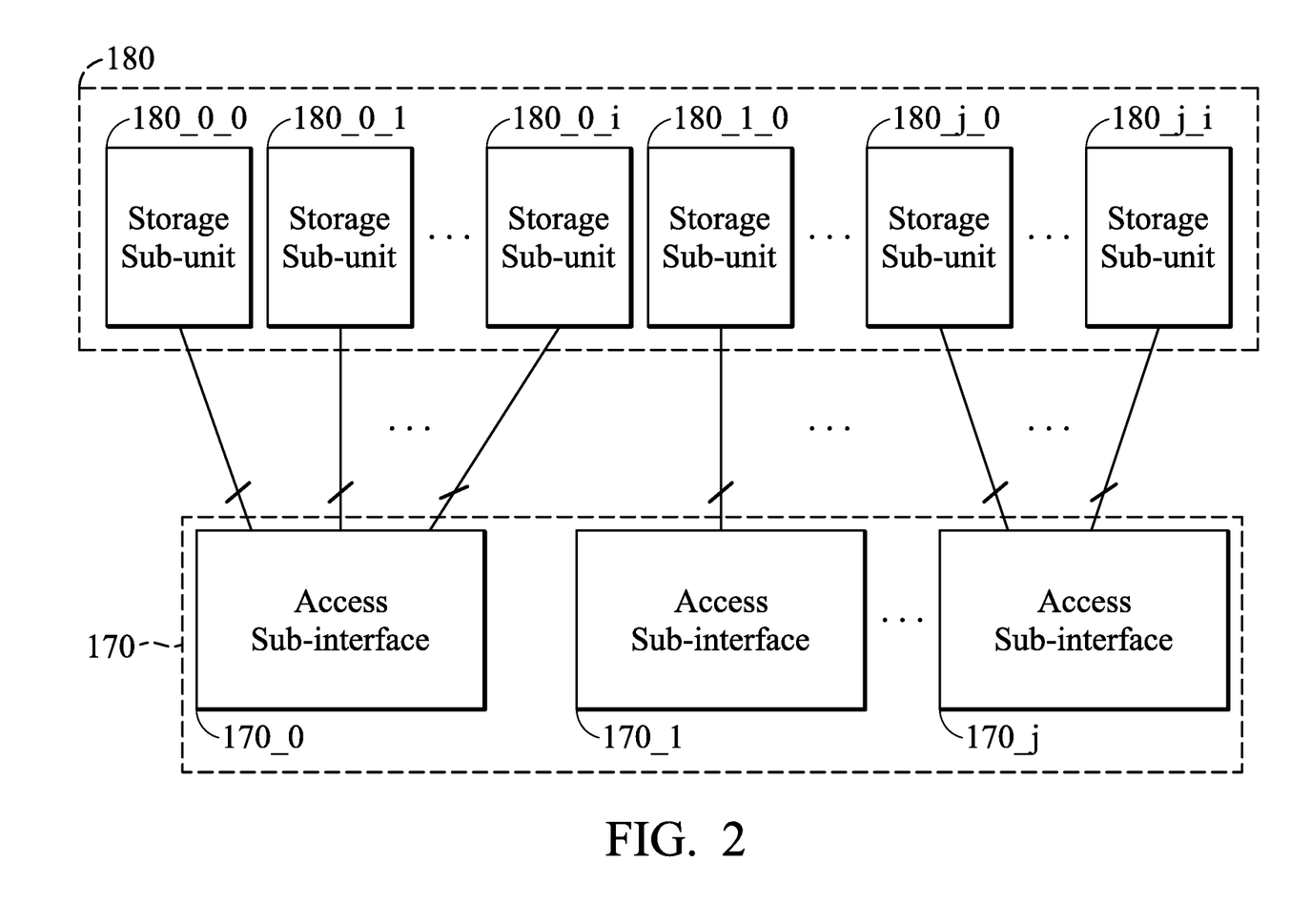
FIG. 2 is a schematic diagram illustrating interfaces to storage units of a flash storage according to an embodiment of the invention.
Figure 3:
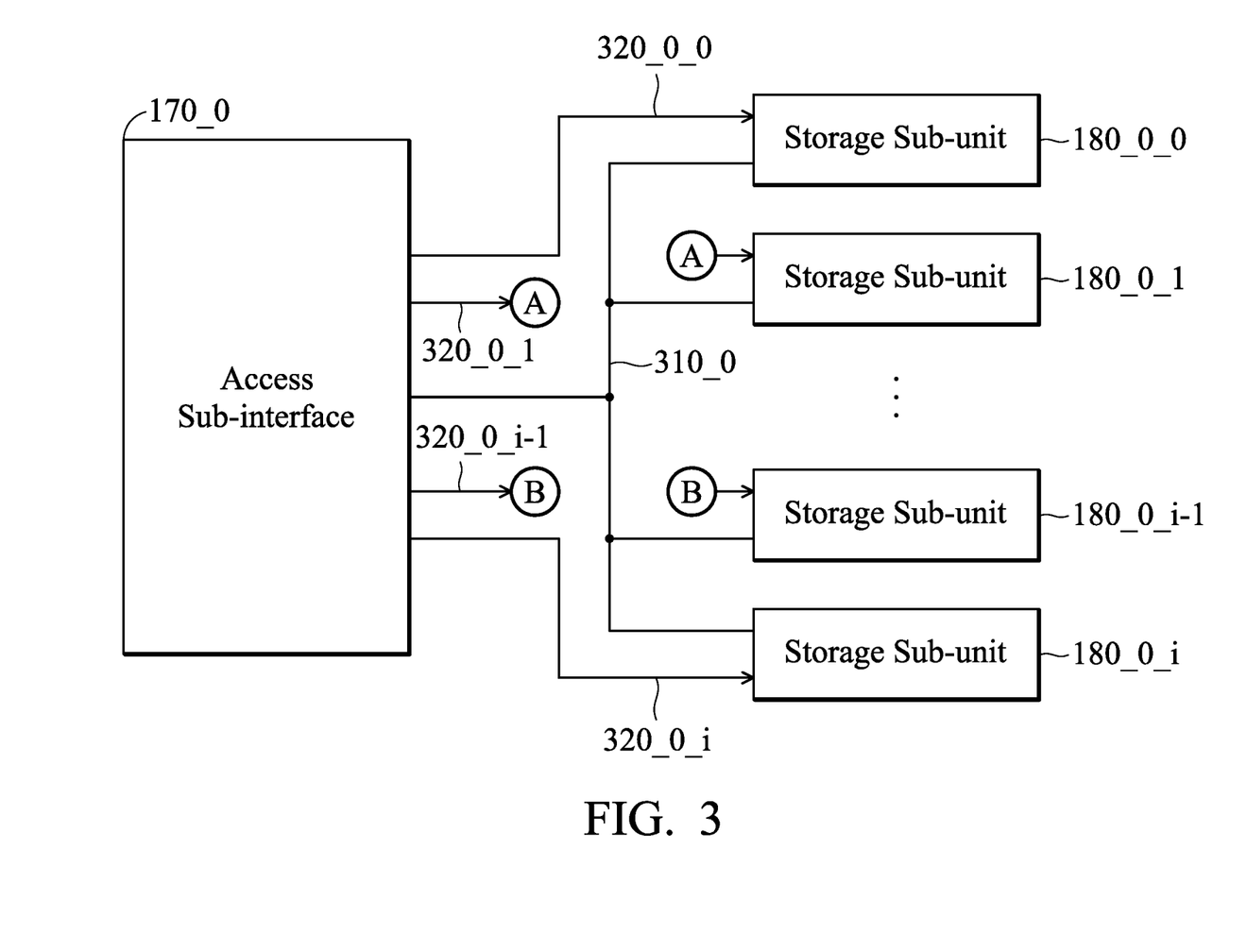
FIG. 3 is a schematic diagram depicting connections between one access sub-interface and multiple storage sub-units according to an embodiment of the invention.

The storage unit 180 may contain multiple storage sub-units and each storage sub-unit may be practiced in a single die and use a respective access sub-interface to communicate with the processing unit 110. FIG. 2 is a schematic diagram illustrating interfaces to storage units of a flash storage according to an embodiment of the invention. The flash memory system 10 may contain j+1 access sub-interfaces 170_0 to 170_j, where the access sub-interfaces may be referred to as channels, and each access sub-interface connects to i+1 storage sub-units. That is, i+1 storage sub-units may share the same access sub-interface. For example, assume that the flash memory contains 4 channels (j=3) and each channel connects to 4 storage sub-units (i=3): The flash memory 10 has 16 storage sub-units 180_0_0 to 180_j_i in total. The processing unit 110 may direct one of the access sub-interfaces 170_0 to 170_j to program data into the designated storage sub-unit. Each storage sub-unit has an independent CE control signal. That is, it is required to enable a corresponding CE control signal when attempting to perform a data write into a designated storage sub-unit via an associated access sub-interface. It is apparent that any number of channels may be provided in the flash memory system 10, and each channel may be associated with any number of storage sub-units, and the invention should not be limited thereto. FIG. 3 is a schematic diagram depicting connections between one access sub-interface and multiple storage sub-units according to an embodiment of the invention. The processing unit 110, through the access sub-interface 170_0, may use independent CE control signals 320_0_0 to 320_0_i to select one of the connected storage sub-units 180_0_0 and 180_0_i, and then program data into the designated location of the selected storage sub-unit via the shared data line 310_0.

The processing unit 110 may use one of two modes to direct the access interface 170 to program data: One is normal write; and the other is test write. A factory may perform test writes in mass production for labeling all bad blocks of the storage unit 180. Normal writes are performed after the flash memory system 10 leaves the factory. When a write command CMD1 issued by the host device 160 instructs a normal write, the processing unit 110 enters the normal write mode. Specifically, in the normal write mode, the processing unit 110 issues a control signal CTRL to direct a data dispatcher 120 to send data DAT1 to the access interface 170 and issues a command CMD2 to direct the access interface 170 to program the data DAT1 into a designated address of the storage unit 180. When a write command CMD1 issued by the host device 160 instructs a test write, the processing unit 110 enters the test write mode. Specifically, in the test write mode, the processing unit 110 issues a control signal CTRL to direct the data dispatcher 120 to send data DAT1 to a test writer 131. The test writer 131 generates test patterns DAT2 according to the data DAT1 and dummy data output from a dummy-data generator 140. Exemplary generation of the test patterns DAT2 will be described in the following paragraphs. Next, the processing unit 110 issues a command CMD2 to direct the access interface 170 to read one or more test patterns DAT2 from the test writer 131 and program the test pattern(s) DAT2 into a designated PBA (physical block address) of the storage unit 180. The data dispatcher 120 may be practiced in a de-multiplexer to couple the data line of the access interface 150 to either the test writer 131 or the access interface 170 according to the control signal CTRL. In the test write mode, the processing unit 110 further issues a command CMD3 to direct the access interface 170 to read test pattern(s) DAT3 from the designated PBA and output the test pattern(s) DAT3 to a test reader 133. The test reader 133 verifies each bit of the test pattern(s) DAT3 for determining whether the read data DAT3 is correct or has error bit(s) and outputs a test result RT' to the processing unit 110. The processing unit 110 replies a test result RT to the host device 160 via the access interface 150.

Figure 4:
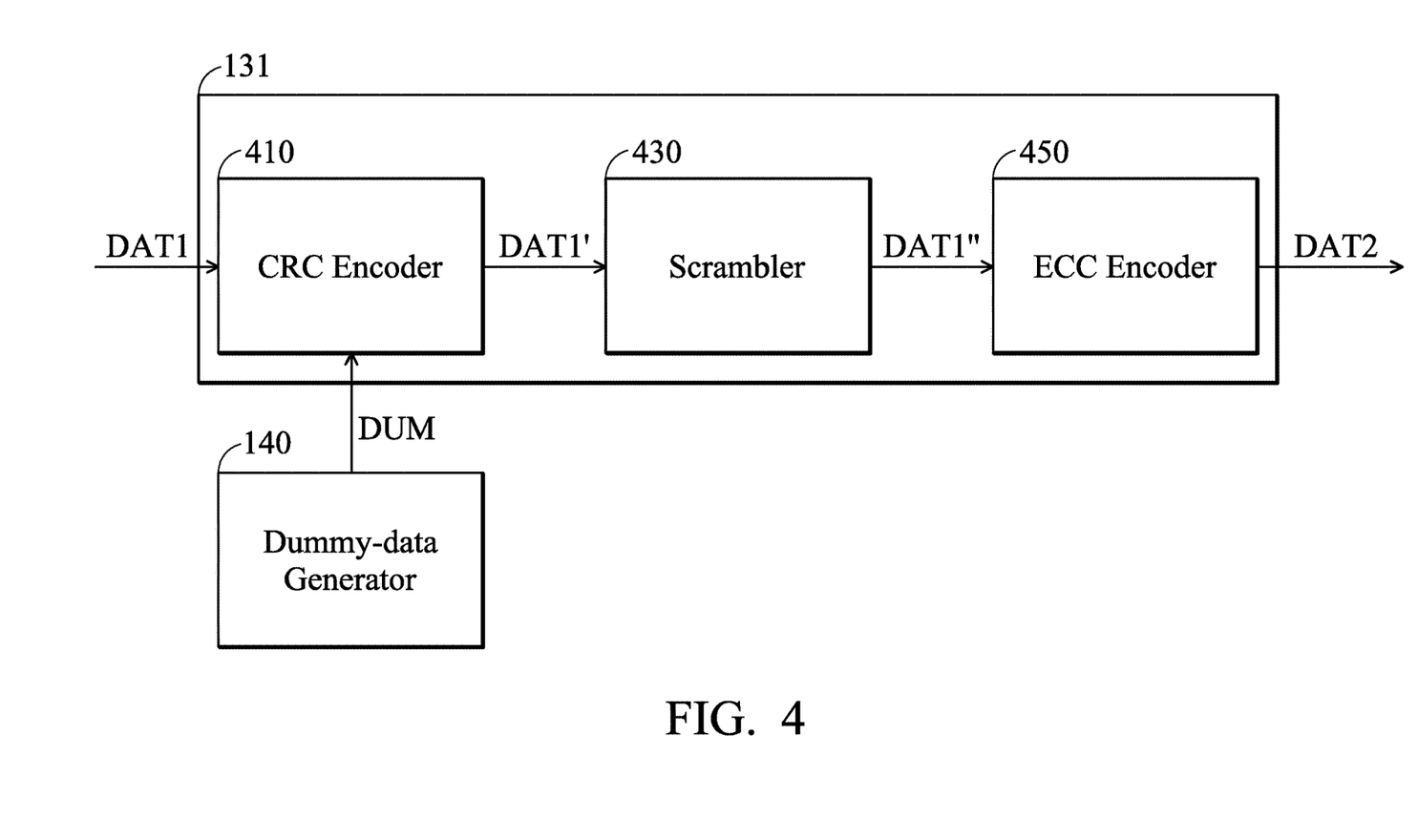
FIG. 4 is a block diagram illustrating a test writer according to an embodiment of the invention.
Figure 5A:
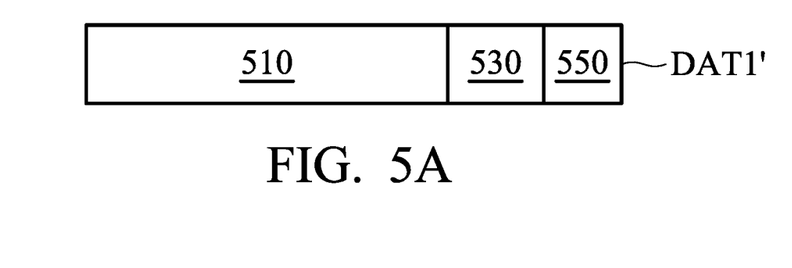
FIG. 5A is a schematic diagram of an output result of a CRC encoder according to an embodiment of the invention.
Figure 5B:
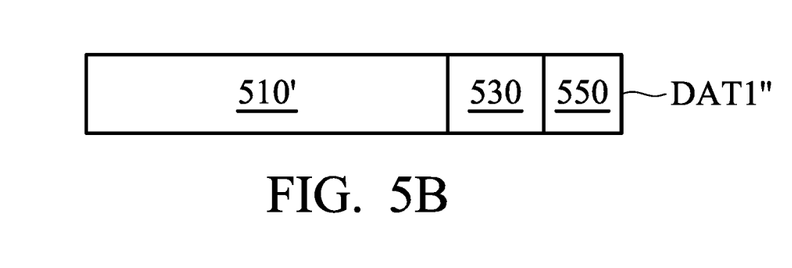
FIG. 5B is a schematic diagram of an output result of a scrambler according to an embodiment of the invention.
Figure 5C:
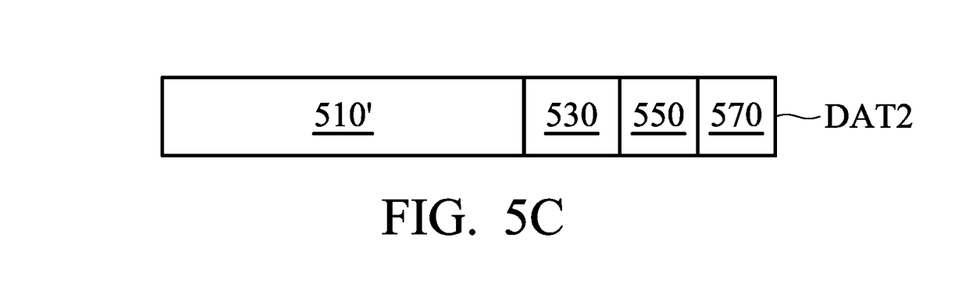
FIG. 5C is a schematic diagram of an output result of an ECC encoder according to an embodiment of the invention.

FIG. 4 is a block diagram illustrating a test writer according to an embodiment of the invention. A test writer 131 contains a CRC (Cyclic Redundancy Check) encoder 410, a scrambler 430 and an ECC (Error-Correcting Code) encoder 450. The CRC encoder 410 may receive metadata DAT1 through the data dispatcher 120 and receive dummy data DUM from the dummy-data generator 140. The CRC encoder 410 encodes the dummy data DUM and the metadata DAT1 by adding a fixed-length parity for the purpose of error detection and outputs a result DAT1' to the scrambler 430. The metadata DAT1 may be a PBA for a test write. In order to optimize the efficiency of data write, the access interface 170 distributes data with continuous LBAs (Logical Block Addresses) across different physical regions of the storage unit 180. Thus, the host device 160 stores a storage mapping table, also referred to as an H2F (Host-to-Flash) table, to indicate which location in the storage unit 180 data of each LBA is physically stored in. That is, the host device 160 has knowledge of converting LBAs to PBAs. FIG. 5A is a schematic diagram of an output result of a CRC encoder according to an embodiment of the invention. An output result DAT1' contains dummy data 510, metadata 530 and a parity 550. The scrambler 430 may use a well-known algorithm to transform the dummy data DUM to random and distinct scrambled data DUM' to ensure DC balance and outputs a result DAT" to the ECC encoder 450. FIG. 5B is a schematic diagram of an output result of a scrambler according to an embodiment of the invention. An output result DAT1" contains scrambled data 510', the metadata 530 and the parity 550. The ECC encoder 450 encodes the scrambled data DUM', the metadata DAT1 and the parity in a redundant way by using an ECC. The redundancy allows an ECC decoder to detect a limited number of errors that may occur anywhere in the message, and often to correct these errors without retransmission. FIG. 5C is a schematic diagram of an output result of an ECC encoder according to an embodiment of the invention. An output result DAT2 contains scrambled data 510', the metadata 530, the parity 550 and the ECC 570.

Figure 6:
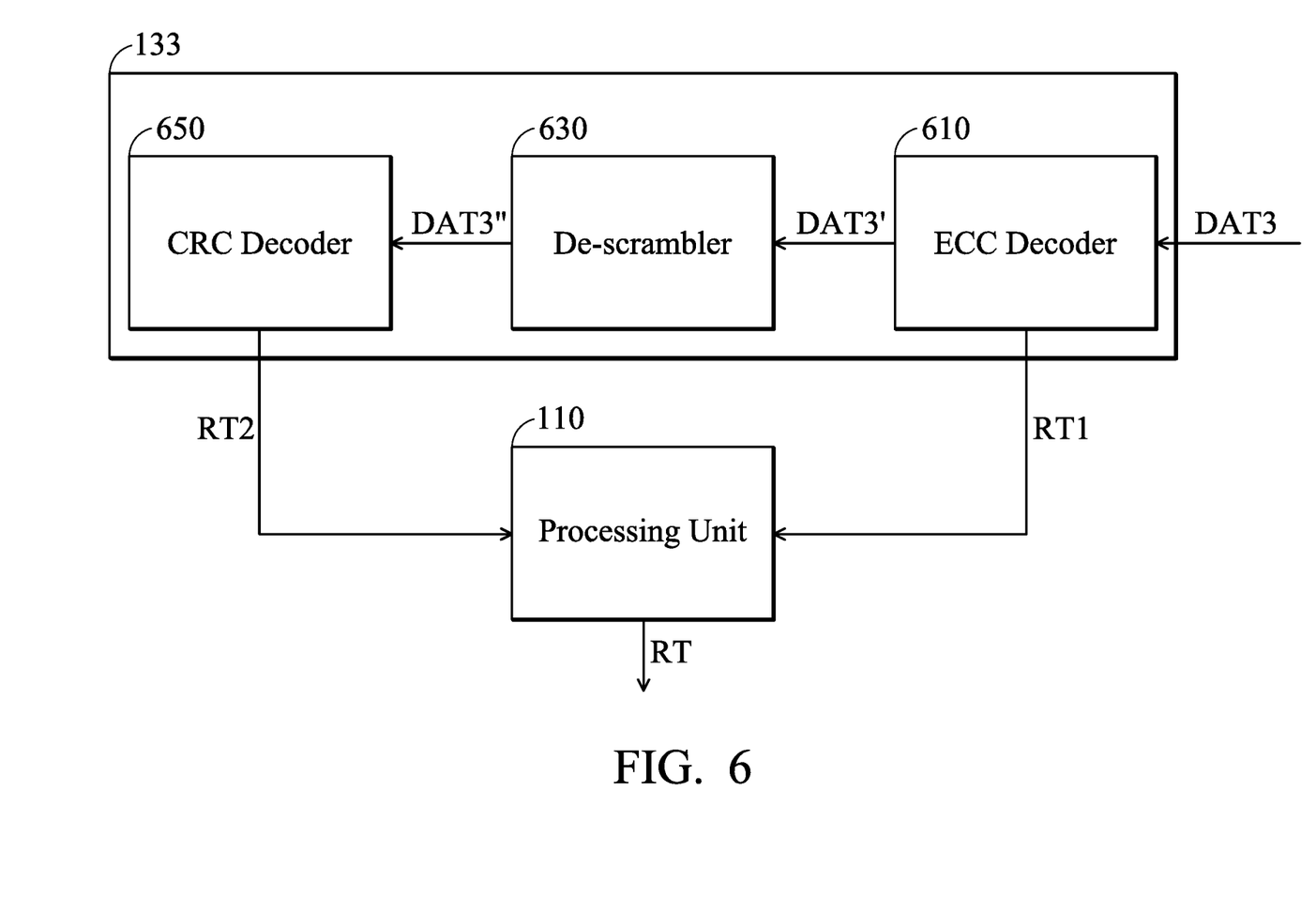
FIG. 6 is a block diagram of a test reader according to an embodiment of the invention.
Figure 7A:
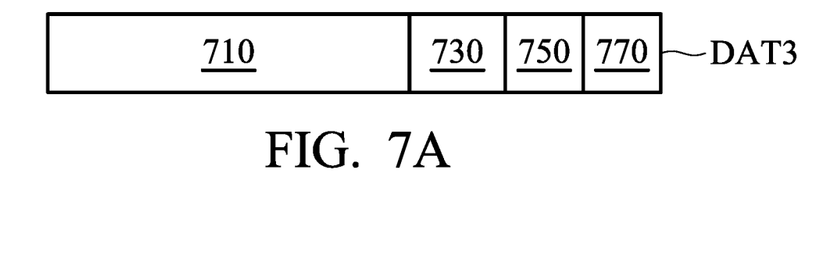
FIG. 7A is a schematic diagram of a test data read by an ECC decoder according to an embodiment of the invention.
Figure 7B:
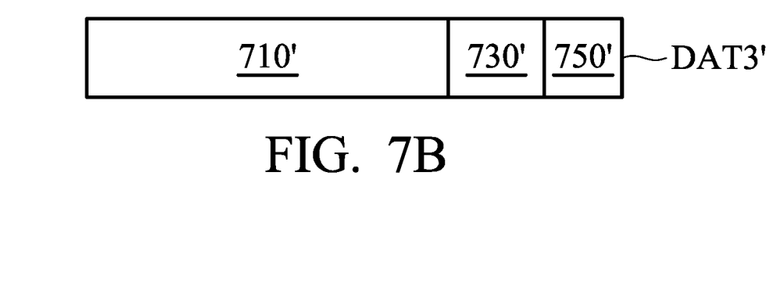
FIG. 7B is a schematic diagram of a test data read by a de-scrambler according to an embodiment of the invention.
Figure 7C:
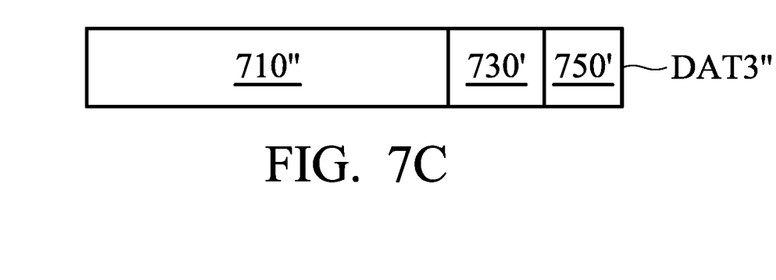
FIG. 7C is a schematic diagram of a test data read by a CRC decoder according to an embodiment of the invention.

FIG. 6 is a block diagram of a test reader according to an embodiment of the invention. A test reader 133 contains an ECC decoder 610, a de-scrambler 630 and a CRC decoder 650. The ECC decoder 610 reads the test data DAT3 from the designated PBA via the access interface 170. FIG. 7A is a schematic diagram of a test data read by an ECC decoder according to an embodiment of the invention. Input data DAT3 may be segmented into parts including scrambled data 710, metadata 730, a parity 750 and an ECC 770. An ECC decoder 610 uses the ECC 770 to determine whether the scrambled data 710, the metadata 730 and the parity 750 have any errors. When no error has been inspected, the ECC decoder 610 transmits a message RT1 to the processing unit 110 to indicate that the test data DAT3 has passed the ECC examination. When an error has been inspected, the ECC decoder 610 attempts to fix the errors in the test data DAT3. When the errors have been fixed successfully, the ECC decoder 610 transmits a message RT1 to the processing unit 110 to indicate that the test data DAT3 has been successfully fixed. When the errors have not been fixed successfully, the ECC decoder 610 transmits a message RT1 to the processing unit 110 to indicate that the test data DAT3 contains unrecoverable errors. Subsequently, the ECC decoder 610 drops the ECC 770 from the test data DAT3 and outputs the error-corrected test data DAT3 to the de-scrambler 630. FIG. 7B is a schematic diagram of a test data read by a de-scrambler according to an embodiment of the invention. Input data DAT3' may be segmented into parts including the (error-corrected) scrambled data 710', metadata 730' and parity 750'. The de-scrambler 630 may use a well-known algorithm to de-scramble the (error-corrected) scrambled data 710' and outputs the de-scrambled data DAT3" to the CRC decoder 650. FIG. 7C is a schematic diagram of test data read by a CRC decoder according to an embodiment of the invention. Input data DAT3" may be segmented into parts including the de-scrambled data 710", the (error-corrected) metadata 730' and parity 750'. The CRC decoder 650 uses the (error-corrected) parity 750' to determine whether the de-scrambled data 710" and the (error-corrected) metadata 730' have any errors. When no error has been inspected, the CRC decoder 650 transmits a message RT2 to the processing unit 110 to indicate that the test data DAT3 has passed the CRC examination. When an error has been detected, the CRC decoder 650 transmits a message RT2 to the processing unit 110 to indicate that the test data DAT3 hasn't passed the CRC examination. The processing unit 110 generates an integrated message RT according to the messages RT1 and RT2 and replies the integrated message RT to the host device 160. In one example, the message RT indicates that the programming of test data into the designated PBA is successful or has failed. In another example, the message RT indicates that test data being programmed into the designated PBA has passed the ECC and CRC examination. In still another example, the message RT indicates that test data being programmed into the designated PBA has passed the ECC examination but failed to pass the CRC examination. The host device 160 determines whether a block corresponding to the designated PBA of the storage unit 180 is labeled as a bad block according to the received message RT. For example, when receiving a message RT indicating that the programming of test data into the designated PBA has failed, the host device 160 labels a block corresponding to the designated PBA of the storage unit 180 as a bad block. Since the flash memory system 10 incorporates the functionalities of the test writer 131 and the test reader 133, the host device 130 needs to transmit only PBAs to the flash memory system 10 to complete complicated test writes, resulting in the reduction of test cost.

Figure 8:
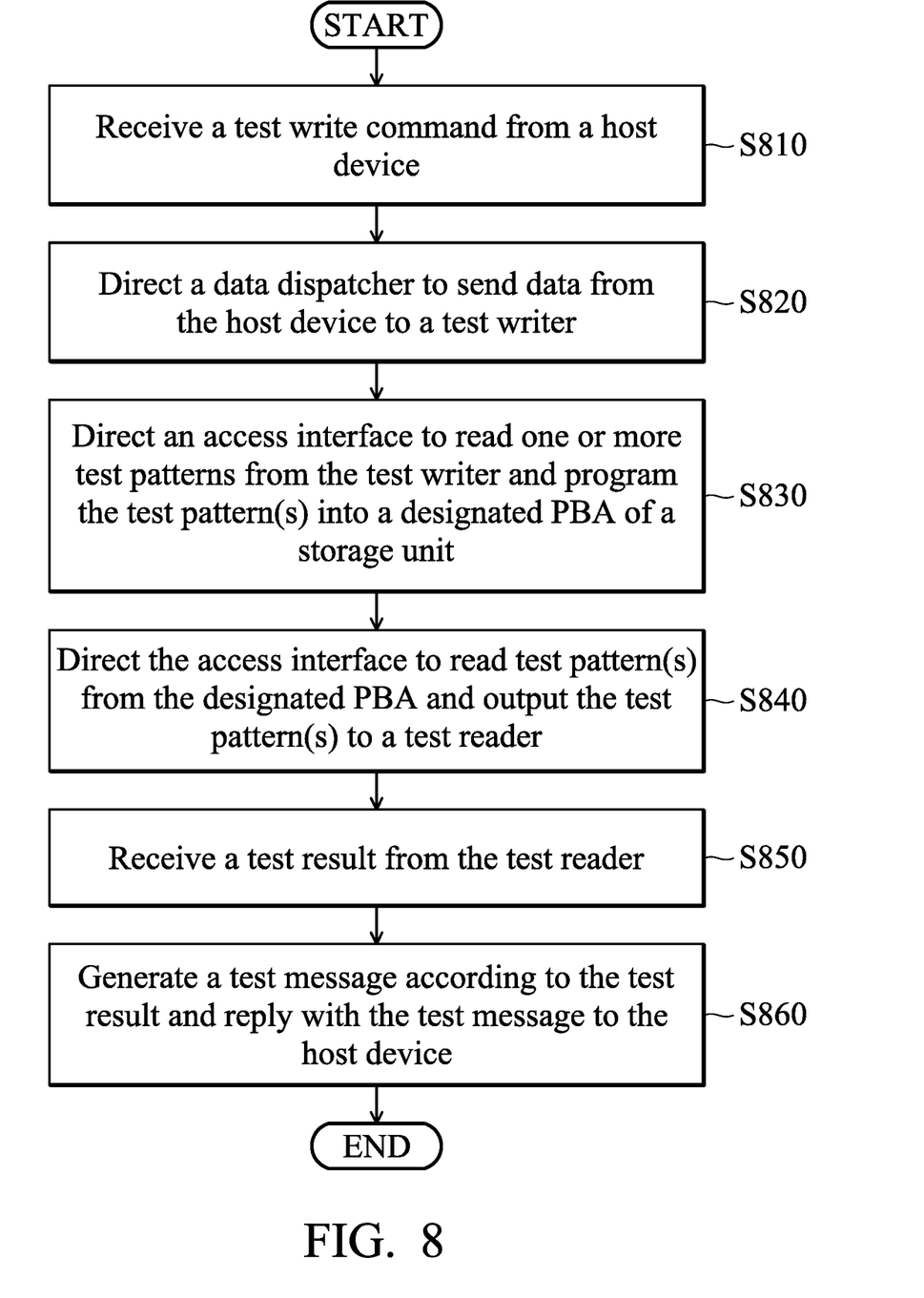
FIG. 8 is a flowchart illustrating a method for testing a storage unit according to an embodiment of the invention.

FIG. 8 is a flowchart illustrating a method for testing a storage unit according to an embodiment of the invention. The method is performed by the processing unit 110 when loading and executing relevant micro-codes or software instructions. After receiving a test write command from the host device 160 through the access interface 150 (step S810), the processing unit 110 issues a control signal CTRL to direct the data dispatcher 120 to send data DAT1 (including a PBA) from the host device 160 to the test writer 131 (step S820). The processing unit 110 issues a command CMD2 to direct the access interface 170 to read one or more test patterns DAT2 from the test writer 131 and program the test pattern(s) DAT2 into a designated PBA of the storage unit 180 (step S830), and next, issues a command CMD3 to direct the access interface 170 to read test pattern(s) DAT3 from the designated PBA and output the test pattern(s) DAT3 to the test reader 133 (step S840). The processing unit 110 receives a test result RT' from the test reader 133 (step S850), generates a test message RT according to the test result RT' and replies with the test message RT to the host device 160 (step S860).

Although the embodiment has been described as having specific elements in FIGS. 1-3, 4 and 6, it should be noted that additional elements may be included to achieve better performance without departing from the spirit of the invention. While the process flow described in FIG. 8 includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for testing a storage unit, performed by a processing unit, comprising:

after receiving a test write command from a host device through a first access interface, generating a control signal to control a test writer to generate a first test pattern comprising first metadata from the host device and dummy data, and directing a second access interface to receive the first test pattern from the test writer and program the first test pattern into a PBA (Physical Block Address) of a storage unit;

directing the second access interface to read a second test pattern from the PBA of the storage unit and output the second test pattern to a test reader;

receiving a test result from the test reader; and generating a test message according to the test result and replying the test message to the host device.

2. The method of claim 1, wherein the host device determines whether a block corresponding to the PBA of the storage unit is labeled as a bad block according to the test message.

3. The method of claim 1, wherein the dummy data are generated from a dummy-data generator.

4. The method of claim 3, wherein the first metadata contains the PBA.

5. The method of claim 3, wherein the first test pattern further comprises scrambled data corresponding to the dummy data, a parity and an ECC (Error-Correcting Code).

6. The method of claim 5, wherein the test writer comprises a CRC (Cyclic Redundancy Check) encoder, a scrambler and an ECC encoder, the CRC encoder encodes the dummy data and the first metadata by adding the parity of a fixed length, the scrambler transforms the dummy data to random and distinct scrambled data and the ECC encoder encodes the scrambled data, the first metadata and the parity by adding the ECC.

7. The method of claim 3, wherein the test reader verifies each bit of the second test pattern and outputs the test result to the processing unit.

8. The method of claim 7, wherein the second test pattern comprises scrambled data, second metadata, a parity and an ECC (Error-Correcting Code).

9. The method of claim 8, wherein the test reader comprises an ECC decoder, a de-scrambler and a CRC (Cyclic Redundancy Check) decoder, the ECC decoder uses the ECC to determine whether the scrambled data, the second metadata and the parity have any errors, and if so, attempts to fix the errors in the scrambled data, the second metadata and the parity, the ECC decoder transmits a first result to the processing unit, the de-scrambler de-scrambles the (error-corrected) scrambled data, and the CRC decoder uses the (error-corrected) parity to determine whether the de-scrambled data and the (error-corrected) metadata have any further errors and transmits a second result to the processing unit.

10. The method of claim 1, wherein the host device stores a storage mapping table to indicate which location in the storage unit data of each LBA (Logical Block Addresses) is physically stored in, and has knowledge of converting LBAs to PBAs.

11. An apparatus for testing a storage unit, comprising:
a test writer, generating a first test pattern comprising first metadata from a host device and dummy data in response to a control signal;
a test reader; and
a processing unit, coupled to the test writer and the test reader, after receiving a test write command from the host device through a first access interface, generating the control signal, directing a second access interface to receive the first test pattern from the test writer and program the first test pattern into a PBA (Physical Block Address) of a storage unit; directing the second access interface to read a second test pattern from the PBA of the storage unit and output the second test pattern to the test reader; receiving a test result from the test reader; and generating a test message according to the test result and replying the test message to the host device.

12. The apparatus of claim 11, wherein the host device determines whether a block corresponding to the PBA of the storage unit is labeled as a bad block according to the test message.

13. The apparatus of claim 11, further comprising:
a dummy-data generator, generating the dummy data.

14. The apparatus of claim 13, wherein the first metadata contains the PBA.

15. The apparatus of claim 13, wherein the first test pattern further comprises scrambled data corresponding to the dummy data, a parity and an ECC (Error-Correcting Code).

16. The apparatus of claim 15, wherein the test writer comprises a CRC (Cyclic Redundancy Check) encoder, a scrambler and an ECC encoder, the CRC encoder encodes the dummy data and the first metadata by adding the parity of a fixed length, the scrambler transforms the dummy data to random and distinct scrambled data and the ECC encoder encodes the scrambled data, the first metadata and the parity by adding the ECC.

17. The apparatus of claim 13, wherein the test reader verifies each bit of the second test pattern and outputs the test result to the processing unit.

18. The apparatus of claim 17, wherein the second test pattern comprises scrambled data, second metadata, a parity and an ECC (Error-Correcting Code).

19. The apparatus of claim 18, wherein, wherein the test reader comprises an ECC decoder, a de-scrambler and a CRC (Cyclic Redundancy Check) decoder, the ECC decoder uses the ECC to determine whether the scrambled data, the second metadata and the parity have any errors, and if so, attempts to fix the errors in the scrambled data, the second metadata and the parity, the ECC decoder transmits a first result to the processing unit, the de-scrambler de-scrambles the (error-corrected) scrambled data, and the CRC decoder uses the (error-corrected) parity to determine whether the de-scrambled data and the (error-corrected) metadata have any further errors and transmits a second result to the processing unit.

20. The apparatus of claim 11, wherein the host device stores a storage mapping table to indicate which location in the storage unit data of each LBA (Logical Block Addresses) is physically stored in, and has knowledge of converting LBAs to PBAs.

* * * * *